United States Patent [19]

Chen et al.

[11] Patent Number: 4,674,090
[45] Date of Patent: Jun. 16, 1987

[54] METHOD OF USING COMPLEMENTARY LOGIC GATES TO TEST FOR FAULTS IN ELECTRONIC COMPONENTS

[75] Inventors: Kong-Chen Chen, San Jose, Calif.; Kees Hage, Apeldoorn, Netherlands

[73] Assignee: Signetics Corporation, Sunnyvale, Calif.

[21] Appl. No.: 695,586

[22] Filed: Jan. 28, 1985

[51] Int. Cl.<sup>4</sup> ..................... G06F 11/00; G01R 31/28
[52] U.S. Cl. .................................. 371/25; 324/73 R
[58] Field of Search ..................... 371/25, 21, 24, 26, 371/27; 324/73 R

[56] References Cited

U.S. PATENT DOCUMENTS

| 4,061,908 | 12/1977 | de Jong | 371/21 |
| 4,363,124 | 12/1982 | Aichelmann | 371/25 |
| 4,369,511 | 1/1983 | Kimura | 371/25 |
| 4,503,387 | 3/1985 | Rutledge | 371/25 |
| 4,503,536 | 3/1985 | Panzer | 371/25 |

OTHER PUBLICATIONS

Foster et al, "Checking Associative Store Address Line Drivers," *IBM Tech. Disc. Bull.*, May 1971, pp. 3867-3868.

*Primary Examiner*—Michael R. Fleming
*Attorney, Agent, or Firm*—R. J. Meetin; R. T. Mayer; J. Oisher

[57] ABSTRACT

A pair of complementary logic gates (A and B) are used to test for faults in a group of electronic components (C1-C3) which provide respective component signals (S1-S3) indicative of their condition. One (A) of the gates ideally generates the logical OR or NOR of the component signals. The other (B) ideally generates their logical AND or NAND. The test procedure involves providing the components with information patterns that would ideally cause all the component signals to go to a logical "0" in one step and to logical "1" in another step. The actual values of the gate output signals (OA and OB) during these two steps are then compared with the respective ideal values to assess the condition of the components.

9 Claims, 5 Drawing Figures

METHOD OF USING COMPLEMENTARY LOGIC GATES TO TEST FOR FAULTS IN ELECTRONIC COMPONENTS

BACKGROUND OF THE INVENTION

1. Field of the Invention

This invention relates generally to electronic test methods and more particularly to methods of testing for faults in a group of electronic components that provide digital signals indicative of component status.

2. Description of the Related Art

Numerous techniques have been developed to test for faults in digital portions of electronic devices. These techniques typically involve applying a suitable pattern of logical "1's" and "0's" to digital components of a device and then monitoring output signals from the components. For example, see U.S. Pat. No. 4,061,908. The problem of testing the components becomes considerably more difficult if the output signals cannot be readily accessed with external test equipment because the lines carrying the signals are "buried" in the device. In particular, the limited pin count of a typical large-scale packaged integrated circuit (IC) severely restricts the observability of the internal state of the IC.

Foster et al, "Checking Associative Store Address Line Drivers," *IBM Tech. Disc. Bull.*, May 1971, pp. 3867-3868, describe one approach to overcoming this difficulty in testing line drivers that control pairs of address lines to a memory. The line drivers are tested for faults with a NAND gate responsive to output signals from test cells that form an extra memory.

A disadvantage of Foster et al is that a significant amount of on-chip test circuitry is needed to perform their test procedure. Furthermore, it depends on the existence of opposite binary signals on each pair of address lines during normal operation. It is desirable to have a more general method in which only a small amount of on-board test circuitry is needed to test for faults in a set of electronic components whose output signals are not readily accessible.

SUMMARY OF THE INVENTION

In accordance with the invention, a pair of complementary logic gates are employed in testing for faults in a group of electrnic components, each of which provides a digital component signal indicative of the status of that component. A fault exists in one of the components when its component signal does not switch from a logical "0" (hereafter usually just "0") to a logical "1" (hereafter usually just "1") or vice versa in response to input data that should cause the signal to switch. That is, the component signal becomes "stuck at" either "0" or "1". Likewise, a "stuck-at" fault exists in one of the gates when its output signal does not switch in response to input data that should cause the signal to switch.

The complementary logic gates are designated as the first and second gates. The first gate generates a gate signal that is ideally either the logical OR or the logical NOR of the component signals. The second gate generates a gate signal that is ideally either the logical AND or the logical NAND of the component signals.

As used herein in describing digital output data that an element such as one of the components or gates provides in response to an input information pattern, "ideal" or "ideally" indicates the particular output data that would be expected in the absence of any stuck-at fault in the element. That is, the "ideal" digital output data is the data produced if the element is operating properly.

In the present method, the gate signals are monitored upon providing the components with an information pattern that would ideally cause all the component signals to go to "0". The gate signals are similarly monitored upon providing the components with an information pattern that would ideally cause all the component signals to go to "1". The actual values produced for the gate signals during these two operations are then respectively compared with the ideal values for the gate signals. A one-to-one match between the actual and ideal values indicates that none of the component signals is stuck at "0" or "1".

If a one-to-one match does not occur, there is normally at least one stuck-at fault in the components and gates. The nature of the mismatch indicates the type of error. Further testing is usually performed to isolate the fault(s) as much as possible. This preferably involves utilizing a "rolling 0" or a "rolling 1" pattern or both on the component signals.

The present invention is especially suited for testing internal electronic components of a device such as an IC where the component signals are not readily accessible. The complementary gates are the only additional circuitry that need be included on the IC. Stuck-at faults can be located with a small number of test patterns. The method has wide applicability since it is not limited by the particular characteristics of the components under test.

BRIEF DESCRIPTION OF THE DRAWINGS

FIG. 3 is a circuit diagram of a content-addressable memory (CAM) testable according to the invention, while

Figure 1:
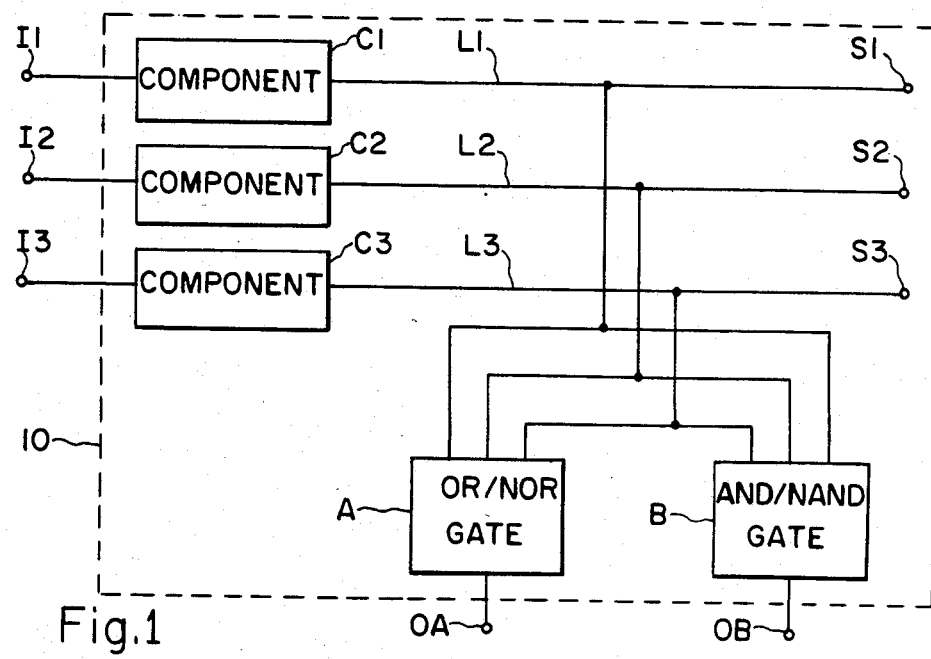
FIG. 1 is a block diagram of a general IC portion testable according to the invention.

Like reference symbols are employed in the drawings and the description of the preferred embodiments to represent the same or very similar item or items. The field-effect transistors (FET's) shown in the drawings are all N-channel insulated-gate transistors. The channel regions in the drawing symbols of the depletion-mode FET's are shown extra thick to distinguish them from enhancement-mode FET's.

DESCRIPTION OF THE PREFERRED EMBODIMENTS

Many types of electrical devices can be tested for stuck-at faults according to the present method. One such device is an IC containing a portion 10 as shown in FIG. 1. The circuitry to be tested is a group of substantially identical electronic components, represented here by components C1, C2, and C3. Each component C1, C2, or C3 responds to a corresponding input signal I1, I2, or I3 to generate a corresponding digital output signal S1, S2, or S3 indicative of the status of that component. Although shown as a single signal, each input I1, I2, or I3 may consist of two or more signals. Lines L1, L2, and L3 that respectively transmit component signals S1–S3 are not connected to input/output pins of the IC and therefore cannot be non-destructively probed after final IC passivation.

Components C1–C3 in combination with lines L1–L3 may be various items. For example, components C1–C3 could be line drivers for a digital bus formed by lines L1–L3. As another example, components C1–C3 could be memory cells whose output signals are carried on lines L1–L3. Other possibilities include analog-to-digital converters, various types of logic gates, and sense amplifiers.

Testing of components C1–C3 is done with multi-input complementary logic gates A and B located in IC portion 10. The input terminals of gates A and B are connected via lines L1–L3 to components C1–C3. Gate A is configured as an OR or NOR gate that provides an outut signal OA. Gate B is configured as an AND or NAND gate that provides an output signal OB. This gives four different complementary arrangements. If gates A and B operate properly, gate signal OA is the logical OR or NOR of signals S1–S3, while gate signal OB is their logical AND or NAND. Signals OA and OB can be made available on output pins of the IC.

The internal configurations of gates A and B are not especially significant as long as they respectively perform the complementary logical functions of OR/NOR and AND/NAND. For example, the fact that gate A is configured as a NAND or AND gate with inverted inputs does not affect the present testing procedure since gate A still functions as an OR or NOR gate under deMorgan's theorem. The same type of comment applies if gate B is configured as a NOR or OR gate with inverted inputs.

Stuck-at errors are conveniently referred to as "S-A" faults. An S-A fault occurs in component C1, C2, or C3 when its output S1, S2, or S3 remains at "0" or "1" even though its input I1, I2, or I3 changes in a way that should cause a switch. Likewise, an S-A fault exists in gate A or B if its output OA or OB does not change in response to appropriate changes in signals S1–S3.

To test for S-A faults, the first step is to adjust inputs I1–I3 in such a manner that signals S1–S3 would ideally all be "0". This is referred to as providing an "all 0" pattern. Conventional test equipment is used to monitor the values of outputs OA and OB during this step. The second step is to adjust inputs I1–I3 so that signals S1–S3 would ideally all be at "1". This is referred to as providing an "all 1" pattern. The OA and OB values are likewise monitored during the second step. The order in which the steps are performed is, of course, immaterial.

The values of OA and OB produced during the "all 0" and "all 1" steps are then respectively compared with the ideal OA and OB values. If a one-to-one match exists, none of component outputs S1–S3 is stuck. Also, neither gate A nor gate B is stuck. A mismatch between the actual and ideal values of OA and OB indicates that one or more S-A faults occur in IC portion 10. The nature of the mismatch gives partial information on the type and location of each S-A fault.

Further data on the S-A fault(s) is preferably obtained by performing a "rolling 0" test or/and a "rolling 1" test. A "rolling 0" test involves adjusting the values of inputs I1–I3 in such a way that a selected one of signals S1–S3 would ideally be at "0" while the others would ideally all be at "1". This is done sequentially with each of S1–S3. A "rolling 1" test is just the opposite. It consists of sequentially adjusting the values of I1–I3 so that each of S1–S3 would, at its turn, ideally be at "1" whereas the others would ideally be at "0".

A particular example more clearly illustrates the features of the test procedure. Consider an embodiment in which gate A is a NOR gate and gate B is an AND gate. For NOR gate A, output OA is (ideally) "1" only when S1–S3 are all "0". Output OB for AND gate B is (ideally) "1" only when S1–S3 are all "1".

Table I shows various combinations for OA and OB that could occur during the "all "0" and "all 1" steps. "S-A-0" means stuck at "0". "S-A-1" means stuck at "1". The ideal result is that (OA,OB) is (1,0) during the "all 0" step and (0,1) during the "all 1" step. If OA and OB actually achieve these values, none of signals S1–S3, A, or B is stuck.

Figure 2A:
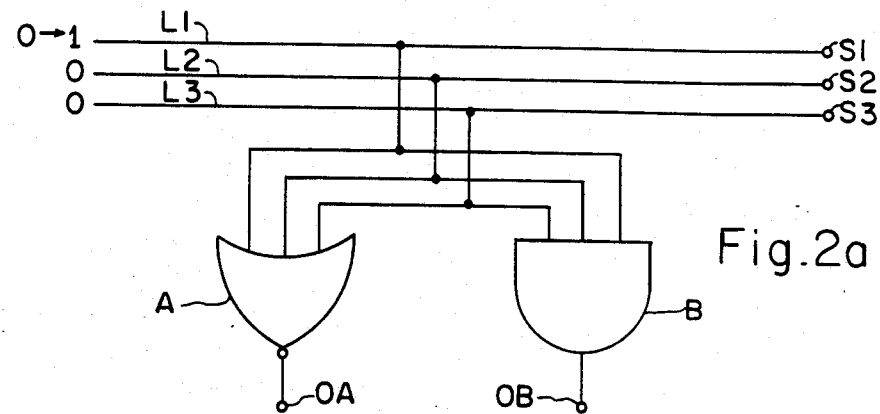
FIGS. 2a and 2b are schematic diagrams respectively illustrating the use of "all 0" and "all 1" patterns in testing the IC portion of FIG. 1.

Turning to FIG. 2a which illustrates the use of the "all 0" pattern for NOR gate A and AND gate B, consider the situation where a mismatch occurs only with OA during the "all 0" step. This could indicate that at least one (but not all) of S1–S3 is S-A-1, for example, S1 as shown in FIG. 2a. However, this could also indicate an S-A-0 fault in gate A.

A "rolling 0" test is done to more particularly locate the possible faults. Table II gives an example of the results that might occur with the "rolling 0" test. Assuming that signal S1 is S-A-1, OB identifies this error by going to "1" when the "rolling 0" reaches S1. OA may still be S-A-0. This cannot be further clarified with the present method. If, however, OB does not go to "1" at any point in the "rolling 0" test, gate A is S-A-0 but none of S1–S3 is stuck.

Figure 2B:
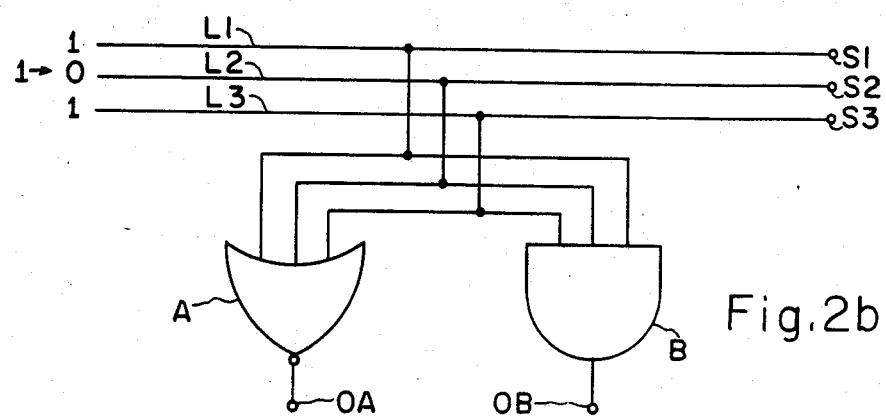

Similarly, consider the situation in which a mismatch occurs only with OB during the "all 1" step. This could mean that one or more (but not all) of S1–S3 are S-A-0, for example, S2 as shown in FIG. 2b. The mismatch could also indicate that gate B has an S-A-0 fault.

This time, a "rolling 1" test is performed to locate the possible faults. Table III shows typical results. OA goes to "0" when the "rolling 1" reaches signal S2 to identify that it is S-A-0. Gate B may still be S-A-0. If OA stays at "1" during the entire rolling "1" test, none of S1–S3 is stuck but an S-A-0 error occurs in gate B.

TABLE I

| Possible Results for A = NOR Gate and B = AND Gate | | | | |
|---|---|---|---|---|
| "All 0" Pattern | | "All 1" Pattern | | |
| OA | OB | OA | OB | Meaning |
| 1 | 0 | 0 | 1 | No gate or component signal stuck |
| 0 | 0 | 0 | 1 | At least 1 comp. sig. S-A-1 or/and OA S-A-0 |
| 1 | 0 | 0 | 0 | At least 1 comp. sig. S-A-0 or/and OB S-A-0 |
| 1 | 0 | 1 | 1 | OA S-A-1 but no component signal S-A-0 |
| 1 | 1 | 0 | 1 | OB S-A-1 but no component signal S-A-1 |
| 0 | 0 | 0 | 0 | Various |
| 0 | 1 | 0 | 1 | multiple |
| 1 | 0 | 1 | 0 | faults |
| 1 | 1 | 1 | 1 | |
| Remaining seven combinations | | Not possible | | |

TABLE II

| Typical Results Using "Rolling 0" Pattern Where At Least One Component Signal S-A-1 or/and OA S-A-0 for A = NOR Gate and B = AND Gate | | | | | |
|---|---|---|---|---|---|
| S1 | S2 | S3 | OA | OB | Meaning |
| 0→1 | 1 | 1 | 0 | 0→1 | S1 stuck at "1" |
| 1 | 0 | 1 | 0 | 0 | S2 not stuck |
| 1 | 1 | 0 | 0 | 0 | S3 not stuck |

TABLE III

Typical Results Using "Rolling 1"
Pattern Where At Least One
Component Signal S-A-0 or/and OB S-A-0
for A = NOR Gate and B = AND Gate

| S1 | S2 | S3 | OA | OB | Meaning |
|---|---|---|---|---|---|
| 1 | 0 | 0 | 1 | 0 | S1 not stuck |
| 0 | 1→0 | 0 | 1→0 | 0 | S2 stuck at "0" |
| 0 | 0 | 1 | 1 | 0 | S3 not stuck |

If a mismatch occurs only with OA during the "all 1" step, gate A is S-A-1 as indicated in Table I. None of S1–S3 is S-A-0. However, one or more (but not all) of S1–S3 might be S-A-1. A "rolling 0" test is performed to identify which, if any, of S1–S3 are S-A-1.

Likewise, gate B is S-A-1 if a mismatch exists only with OB during the "all 0" step. None of S1–S3 is S-A-1. At least one (but not all) of S1–S3 might, however, be S-A-0. A "rolling 1" test identifies which, if any, of S1–S3 are S-A-0.

Each of the four mismatch situations just discussed may involve only a single fault in IC portion 10. There are eleven mismatch cases remaining. Four of these cases indicate multiple S-A faults, while the last seven should not happen.

The multiple-fault situations are itemized in Table I. They are clarified by performing the "rolling 0" or/and "rolling 1" tests. Since interpretation of the test results can become quite complicated, no further discussion is presented here. Based on the previous material, a person skilled in the digital testing art should be able to suitably analyze these situations.

If any of the "not possible" combinations of OA and OB do occur, the external test equipment may be at fault. Alternatively, the device under test may contain a design error, or the "all 0" and "all 1" tests may not have been performed properly. Another possibility is that a fault arose in IC portion 10 between the "all 0" and "all 1" steps or while the latest of these steps was being conducted. In general, the "all 0" and "all 1" steps should be repeated.

The situations that can arise with the other arrangements of the complementary logic gates are quite similar to the preceding NOR/AND situations. Table IV partially illustrates the possible results when gate A is an OR gate and gate B is an AND gate.

TABLE IV

Possible Results for A = OR Gate and B = AND Gate

| "All 0" Pattern | | "All 1" Pattern | | |
|---|---|---|---|---|
| OA | OB | OA | OB | Meaning |
| 0 | 0 | 1 | 1 | No gate or component signal stuck |
| 1 | 0 | 1 | 1 | At least 1 comp. sig. S-A-1 or/and OA S-A-1 |
| 0 | 0 | 1 | 0 | At least 1 comp. sig. S-A-0 or/and OB S-A-0 |
| 0 | 0 | 0 | 1 | OA S-A-0 but no component signal S-A-0 |
| 0 | 1 | 1 | 1 | OB S-A-1 but no component signal S-A-1 |
| Other combinations | | | | Various multiple faults or not possible |

Figure 3:
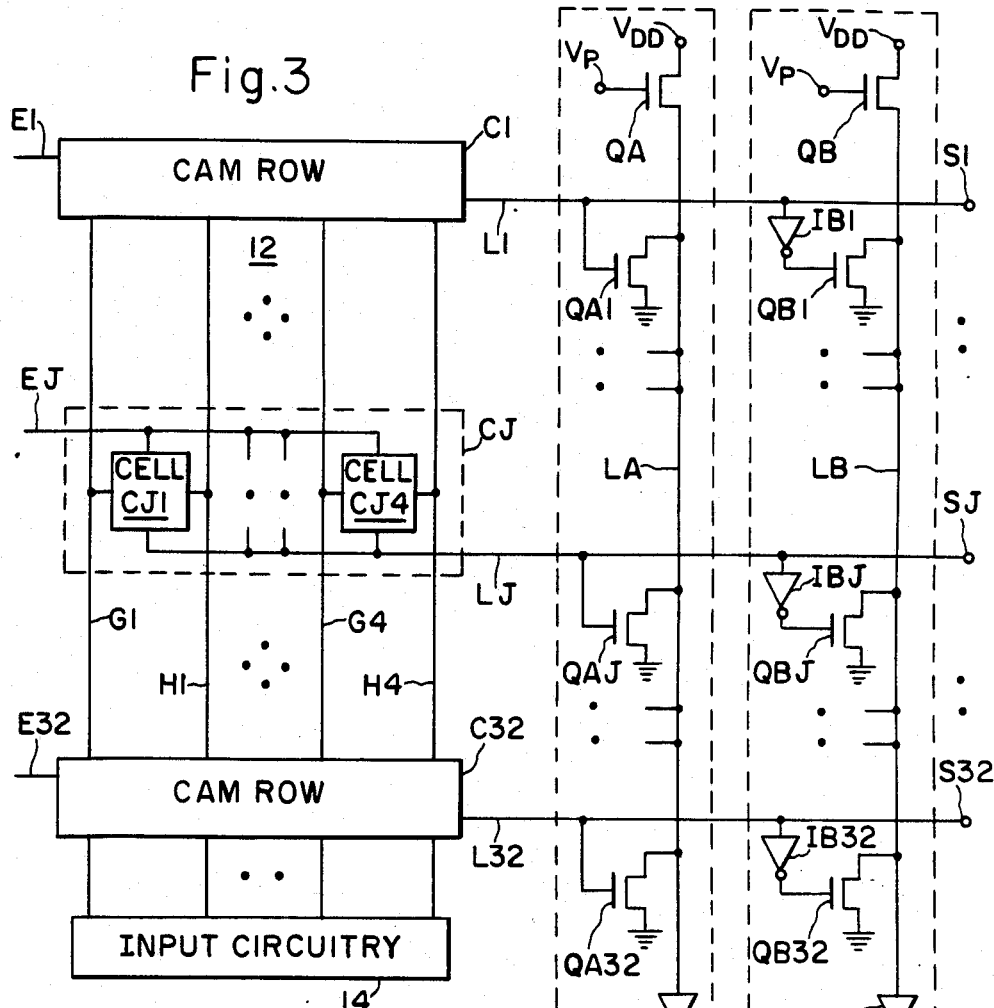

Moving to FIG. 3, it illustrates a content-addressable memory 12 that can be tested for S-A faults according to the present invention. CAM 12 contains a set of substantially identical CAM cells arranged in a matrix of 32 rows by four columns connected to four-bit input circuitry 14. Symbols "C1...CJ...C32" are used for the rows in FIG. 3 in correspondence with symbols "C1–C3" used for the components under test in FIG. 1. However, the components under test in CAM 12 can also extend to circuitry 14. The external connections for cells CJ1 and CJ4 in typical row CJ consist of an enable line EJ and a match line LJ. Typical cell CJ1 is connected between bit lines G1 and H1 in the first column. The bit lines G1–H4 and the match lines L1–L32 are also connected to suitable pull-up circuitry (not shown).

Figure 4:
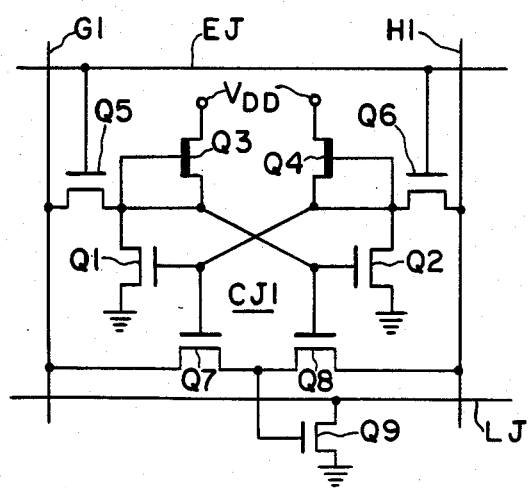
FIG. 4 is a circuit diagram of a typical CAM cell in FIG. 3.

Each CAM cell, as represented by typical cell CJ1 in FIG. 4, is a conventional FET cell of the type disclosed in European Patent Publication No. 75,711. Cell CJ1 contains a static random-access memory (RAM) portion and a comparator portion. The RAM portion consists of cross-coupled storage FET's Q1 and Q2, resistive load FET's Q3 and Q4, and access FET's Q5 and Q6. The comparator portion which is connected to match line LJ consists of FET's Q7, Q8, and Q9. The RAM and comparator portions operate between ground reference and a positive supply voltage $V_{DD}$.

In brief, a data bit is written into cell CJ1 from lines G1 and H1 when line EJ is at a sufficiently high voltage to turn on FET's Q5 and Q6. A comparison (or interrogation) operation to determine whether the bit stored in cell CJ1 matches an input bit on lines G1 and H1 is done when the EJ voltage is low. If the stored bit is the same as the input bit presented for comparison, FET Q9 is off. This represents a match which allows line LJ to go to a high voltage if matches occur in all the other cells of row CJ. If the input bit differs from the stored bit, FET Q9 is on and pulls the LJ voltage low to indicate a mismatch.

Returning to FIG. 3, gate A is a conventional OR gate consisting of switching FET's QA1...QAJ... and QA32, a resistive pull-up FET QA, and an inverter IA arranged as shown. Similarly, gate B is a NAND gate consisting of inverters IB1...IBJ...IB32, switching FET's QB1...QBJ...QB32, a resistive pull-up FET QB, and an inverter IB arranged conventionally as shown.

CAM 12 is tested in two sets of steps. The first set checks on S-A-1 faults in the cells. The second checks on S-A-0 faults in the cells.

The first set of steps begins with a write operation in which input circuitry 14 generates (or attempts to generate) an information pattern that would ideally write "0's" in all the cells. An "all 1" pattern is provided for signals S1–S32 by having circuitry 14 supply (or attempt to supply) an "all 0" four-bit word for comparison. Ideally, (OA,OB) is (1,0). If OA is actually "0", either gate A is S-A-0 or S1–S32 are all S-A-0 (unlikely). A "1" value for OB indicates one or more of the following: gate B is S-A-1; at least one of S1–S32 is S-A-0; one or more cells are S-A-1.

Next, four "all 0" patterns are provided for signals S1=S32 by having input circuitry 14 sequentially generate (or attempt to generate) comparisons with words in which a solitary "1" is moved from bit to bit in circuitry 14. This is called a "running 1". The ideal result for (OA,OB) is (0,1) during each "all 0" pattern. A "1" value for OA during the entire "running 1" sequence means one or more of the following: gate A is S-A-1; at least one of S1–S32 is S-A-1; every column has at least one cell S-A-1; circuitry 14 is S-A-0. If OA switches between "0" and "1" during the "running 1" sequence, each time that OA goes to "1" indicates that the corresponding column has one or more cells S-A-1 or that the corresponding bit in circuitry 14 is S-A-0. Similarly, a "0" for OB during the entire "running 1" sequence means one or more of the following: gate B is S-A-0; S1–S32 are all S-A-1 (unlikely); circuitry 14 is S-A-0. If OB switches between "0" and "1", each instance that OB goes to "0" identifies an S-A-0 bit in circuitry 14.

The second set of steps is a duplicate of the first set except that input circuitry 14 supplies (or attempts to supply) identically the opposite information to that of the first set. Accordingly, the interpretation of results given in the previous two paragraphs applies to the second set except that "S-A-0" should be substituted for any of the "S-A-1" references to the cells, and vice versa for the bits in circuitry 14.

If it is desirable to identify particular ones of signals S1–S32 that are stuck and, perhaps, particular cells that are stuck, "rolling 0" and "rolling 1" tests of the type described for FIG. 1 can be employed. These tests involve writing different data into the rows and then making appropriate comparisons.

While the invention has been described with reference to particular embodiments, this description is solely for the purpose of illustration and is not to be construed as limiting the scope of the invention claimed below. For example, the components under test could be located on a printed circuit board together with, or separately from, the complementary logic gates. If the lines carrying the component signals are "buried" in the circuit board, use of the invention would yield the same advantages that arise when the components under test are buried in an IC. Even if the lines are not buried in the circuit board, the testing time may be reduced compared to prior art techniques. Thus, various modifications, changes, and applications may be made by those skilled in the art without parting from the true scope and spirit of the invention as defined by the appended claims.

What is claimed is:

1. A method for testing for faults in a group of electronic components each of which provides a digital component signal indicative of the status of that component, wherein a first gate generates a first gate signal that is ideally the logical OR or the logical NOR of the component signals, and wherein a second gate generates a second gate signal that is ideally the logical AND or the logical NAND of the component signals, characterized by the steps of:

monitoring the first and second gate signals upon providing the components with an information pattern that would ideally cause the component signals to all go to logical "0";

monitoring the first and second gate signals upon providing the components with an information pattern that would ideally cause the component signals to all go to logical "1"; and comparing the actual values produced for the first and second gate signals during the monitoring steps with the respective ideal values of the first and second gate signals to ascertain whether any faults exist in the components and gates.

2. A method as in claim 1 in which the comparing step indicates the possible existence of at least one fault in the components, characterized by at least one of the following two steps in conjunction with the third-mentioned step below:

sequentially selecting each component and, after each selection, monitoring the first and second gate signals upon (1) providing an information pattern to the selected component that would ideally cause its component signal to go to logical "0" and (2) providing an information pattern to the remaining components that would ideally cause their component signals to go to logical "1";

sequentially selecting each component and, after each selection, monitoring the first and second gate signals upon (1) providing an information pattern to the selected component that would ideally cause its component signal to go to logical "1" and (2) providing an information pattern to the remaining components that would ideally cause their component signals to go to logical "0";

comparing the actual values produced for the first and second gate signals during each sequentially selecting step with the respective ideal values of the first and second gate signals.

3. A method as in claim 1 in which the comparing step does not exclude the possibility that at least one of the component signals is stuck at logical "1", characterized by the steps of:

sequentially selecting each component and, after each selection, monitoring the first and second gate signals upon (1) providing an information pattern to the selected component that would ideally cause its component signal to go to logical "0" and (2) providing an information pattern to the remaining components that would ideally cause their component signals to go to logical "1"; and comparing the actual values produced for the first and second gate signals during the sequentially selecting step with the respective ideal values for the first and second gates signals.

4. A method as in claim 1 where the comparing step does not exclude the possibility that at least one of the component signals is stuck at logical "0", characterized by the steps of:

sequentially selecting each component and, after each selection, monitoring the first and second gate signals upon (1) providing an information pattern to the selected component that would ideally cause its component signal to go to logical "1" and (2) providing an information pattern to the remaining components that would ideally cause their component signals to go to logical "0"; and comparing the actual values produced for the first and second gate signals during the sequentially selecting step with the respective ideal values for the first and second gate signals.

5. A method as in claim 1 characterized in that the components and gates are part of a single electronic device.

6. A method as in claim 5 characterized in that the device is an integrated circuit.

7. A method as in claim 6 characterized in that the component signals are not accessible through input/output pins of the integrated circuit.

8. A method as in claim 5 characterized in that each component provides its component signal on a conductive line coupled to an input terminal of each gate.

9. A method as in claim 1 characterized in that the occurrence of a one-to-one match of the actual values of the first and second gate signals to their respective ideal values indicates that no fault exists in the components and gates whereas the non-occurrence of such a match indicates that there is at least one fault in the components and gates.

* * * * *